(12) United States Patent
Kuo et al.

(10) Patent No.: US 10,948,643 B2
(45) Date of Patent: Mar. 16, 2021

(54) OPTICAL FILM

(71) Applicant: BenQ Materials Corporation, Taoyuan (TW)

(72) Inventors: Chen-Kuan Kuo, Taoyuan (TW); Kuo-Jui Huang, Taoyuan (TW); Wei-Sheng Cheng, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 24 days.

(21) Appl. No.: 16/417,726

(22) Filed: May 21, 2019

(65) Prior Publication Data

US 2020/0313121 A1 Oct. 1, 2020

(30) Foreign Application Priority Data

Mar. 27, 2019 (TW) ................................ 10811065.6

(51) Int. Cl.
*G02B 5/30* (2006.01)
*H01L 51/52* (2006.01)
*H01L 27/32* (2006.01)
*H01L 51/00* (2006.01)

(52) U.S. Cl.
CPC ......... *G02B 5/3025* (2013.01); *G02B 5/3083* (2013.01); *H01L 27/3244* (2013.01); *H01L 51/0097* (2013.01); *H01L 51/5281* (2013.01); *H01L 2251/5338* (2013.01); *Y10T 428/24942* (2015.01); *Y10T 428/24959* (2015.01); *Y10T 428/24967* (2015.01)

(58) Field of Classification Search
CPC .. B32B 7/00–7/14; H01L 51/00–51/56; G02B 5/00–5/32; G02B 1/00–1/18
See application file for complete search history.

(56) References Cited

U.S. PATENT DOCUMENTS

| | | | |
|---|---|---|---|
| 2016/0101593 A1* | 4/2016 | Nam | B32B 3/04 428/213 |
| 2017/0200915 A1* | 7/2017 | Lee | H01L 51/5237 |
| 2017/0247579 A1* | 8/2017 | Kwak | C08F 220/18 |
| 2017/0373121 A1* | 12/2017 | Leng | H01L 27/3244 |

FOREIGN PATENT DOCUMENTS

TW 201633088 A 9/2016

* cited by examiner

*Primary Examiner* — Prashant J Khatri

(57) ABSTRACT

An optical film for a cover plate of a flexible display, which is disposed on the display side of the flexible display, is disclosed. The optical film sequentially includes an optical substrate layer adjacent to the flexible display, a first adhesive layer, a polarizing layer, a second adhesive layer and a surface functional film which is disposed on the folding side of the flexible display. The optical film having excellent bending resistance and recovery property can be obtained by adjusting the ratio of the integrated bending modulus of the optical substrate layer, the polarizing layer, and the surface functional film to the total thickness of the optical film.

9 Claims, 6 Drawing Sheets

OPTICAL FILM

RELATED APPLICATIONS

This application claims priority to Taiwan Application Ser. No. 108110656 filed on Mar. 27, 2019, which is herein incorporated by reference.

BACKGROUND OF THE INVENTION

Field of the Invention

The invention relates to an optical film for a cover plate of a flexible display which has good bending resistance and excellent restoring property after unfolding to maintain flatness.

Description of the Related Art

With the development of increasing portability of the portable devices, organic light-emitting diode (OLED) displays or polymer light-emitting diode (PLED) displays with flexible properties have many folding or bending applications. However, in the case of the OLED display applied to a flexible portable device, an additional optical film, such as anti-reflection film or barrier film, is required to be used as a cover plate on the display side for use in different environments, and to enhance optical effects or durability. Therefore, the OLED display itself and the optical film thereon all need to be flexible to withstand multiple folds.

In the current flexible polymer substrates for flexible portable devices, the materials for the flexible polymer substrates can be chosen because the materials must have optical transparency, bending resistance, flexibility, and even a certain mechanical strength to maintain the basic impact resistance of the flexible display at the same time. Therefore, conventionally, a transparent polyimide (PI) or a modified polyimide film is used as the flexible polymer substrate, and a functional optical layer or a surface coating layer is added to the flexible polymer substrate to form a plurality of flexible optical films for use in the cover plate of OLED displays. However, as the increasing of the mechanical design variability of the flexible portable device and the OLED displays, the composite optical film used for the cover plate of the OLED displays must also change different material of each layer or adjust the configuration of bending modulus of the layers to bear the stress of different degrees.

In addition, the conventional flexible portable devices can be divided into an outward folding mode and an inward folding mode according to different folding sides. Referring to FIG. 1A and FIG. 1B, as shown in FIG. 1A, which is a schematic diagram of the relative position of the conventional cover plate 1 and the OLED display 2 in the flexible portable device in the outward folding mode, the conventional cover plate 1 is disposed on the display side 4 of the OLED display 2, and relatively far from folding side 3. As shown in FIG. 1B, which is another schematic diagram of the relative position of the conventional cover plate 1 and the OLED display 2 in the flexible portable device in the inward folding mode, the conventional cover plate 1 is disposed on the display side 4 of the OLED display 2 and is on the same side as the folding side 3. It can be seen from the schematic diagram that when the thickness of the flexible portable device and the OLED display 2 in the outward folding mode and the inward folding mode are substantially the same, the conventional cover plate 1 has a larger folding curvature radius R1 in the outward folding mode than a folding curvature radius R2 in the inward folding mode, and the bending portion of the OLED display 2 closed to the folding side 3 generally has more space for accommodating the rotating shaft mechanism in outward folding mode. Therefore, the local stress of the bending portion of the cover plate 1 is small and can be further released and dispersed by the mechanical design of the flexible portable device, and the cover plate 1 is not easily fatigue or damaged. However, when the cover plate 1 is in the inward folding mode, the bending portion generally has a smaller folding curvature radius R2 than the folding curvature radius R1 in the outward folding mode, and because the folding side 3 of the conventional cover plate 1 and the display side 4 of the OLED display 2 are on the same side, in order not to affect the display screen, it is not possible to provide a space for accommodating the hinge mechanism on the display side 4, and it is necessary to rely on the material itself of the conventional cover plate 1 and the composite layer structure to withstand the repeatedly folding stress of the bending portion of the cover plate 1, and therefore, the cover plate 1 of the flexible portable device has greater design difficulty in inward folding mode.

Accordingly, the present invention have proposed an optical film for the cover plate of the flexible display, which can provide better dynamic and static bending stress resistance properties in the inward folding mode by adjusting the ratio of the integrated bending modulus of the plurality of layers to the thickness of the optical film, and the optical film can still maintain flatness by the excellent recovery of the optical film itself after being folded and unfolded for a large number of times.

SUMMARY OF THE INVENTION

In an aspect of the optical film of present invention, a optical film for a cover plate of a flexible display which is disposed on a display side of the flexible display sequentially includes an optical substrate layer adjacent to the flexible display, a first adhesive layer, a polarizing layer, a second adhesive layer, and a surface functional film which is disposed on a folding side of the flexible display, wherein the optical film satisfies the following formula (1):

$$17.49 \times 10^{-3} \text{ (Gpa/}\mu\text{m)} \leq E'/T \leq 18.77 \times 10^{-3} \text{ (GPa/}\mu\text{m)} \qquad (1)$$

wherein T represents a total thickness of the optical film, and the total thickness T is between 152 μm and 191 μm, and E' is an integrated bending modulus obtained by three-point bending test and calculated by the following formula (2):

$$E' = L^3 F / 4wt^3 d \qquad (2)$$

wherein F represents a stress applied to the optical film in the three-point bending test, L represents a measuring length of the optical film, w represents a measuring width of the optical film, d represents a strain of the optical film in thickness direction, and t represents a total thickness of the optical substrate layer, the polarizing layer, and the surface functional film.

In another aspect of the optical film of present invention, the integrated bending modulus is in a range of 2.65 Gpa to 3.58 Gpa.

In other aspect of the optical film of present invention, the first adhesive layer has a first thickness t1 in a range of 5 μm to 12 μm, and the second adhesive layer has a second thickness t2 in a range of 5 μm to 12 μm.

In other aspect of the optical film of present invention, the ratio of the first thickness t1 of the first adhesive layer to the total thickness T of the optical film is between 6.28% and 7.32%, and the ratio of the second thickness t2 of the second adhesive layer to the total thickness T of the optical film is between 3.05% and 7.02%.

In other aspect of the optical film of present invention, the first thickness t1 of the first adhesive layer is greater than or equal to the second thickness t2 of the second adhesive layer.

In other aspect of the optical film of present invention, a storage modulus G' of the second adhesive layer is greater than a storage modulus G' of the first adhesive layer.

In other aspect of the optical film of present invention, the optical substrate layer has a thickness in a range of 38 μm to 57 μm, the polarizing layer has a thickness in a range of 38 μm to 57 μm, and the surface functional film has a thickness in a range of 43 μm to 67 μm.

In other aspect of the optical film of present invention, the ratio of the total thickness t of the optical substrate layer, the polarizing layer, and the surface functional film to the total thickness T of the optical film is between 85.96% and 89.63%.

In other aspect of the optical film of present invention, the optical film further comprises a third adhesive layer between the optical substrate layer and the flexible display to directly attach the optical film to the flexible display.

In other aspect of the optical film of present invention, the optical substrate layer, the polarizing layer, and the surface functional film are made of materials selected from the group consisting of polyimide, poly(ethylene terephthalate), poly(methyl methacrylate) polymer, epoxy resin polymer, polysiloxane polymer, cellulose acetate polymer, and a combination thereof.

In other aspect of the optical film of present invention, the optical substrate layer comprises a coating-type retardation film, an extending-type retardation film or a microstructure-type retardation film.

In other aspect of the optical film of present invention, the polarizing layer comprises an extending-type polarizer or a coating-type polarizer In other aspect of the optical film of present invention, the surface functional film is selected from the group consisting of an anti-glare film, a hard coating film, an anti-fouling film, a barrier film, and a combination thereof.

The above and other aspects of the invention will become better understood with regard to the following detailed description of the preferred but non-limiting embodiment(s). The following description is made with reference to the accompanying drawings.

DETAILED DESCRIPTION OF THE INVENTION

Please note the drawings shown in the Figures are for illustrative purposes only and not to scale.

Figure 1B:
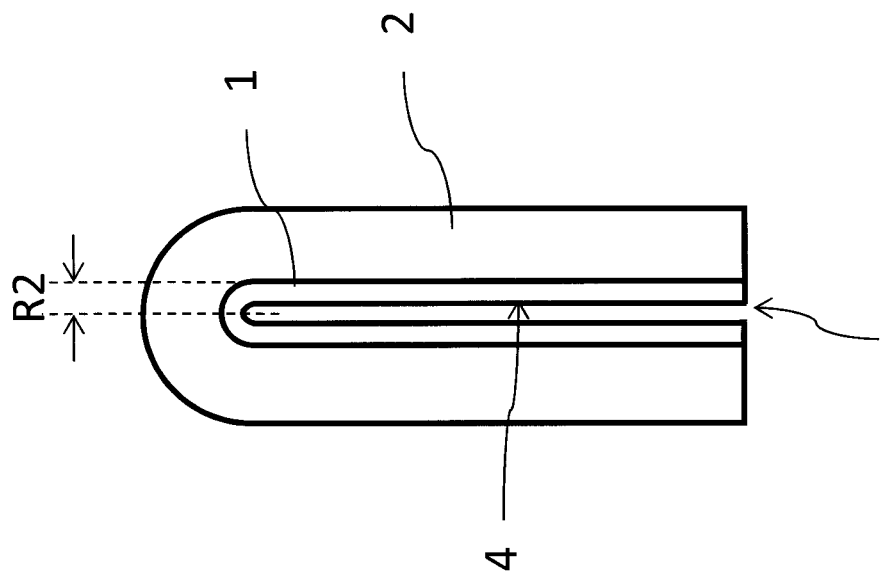
FIG. 1B shows a schematic diagram of the relative position of the conventional cover plate and the OLED display in the flexible portable device in the inward folding mode.
Figure 1A:
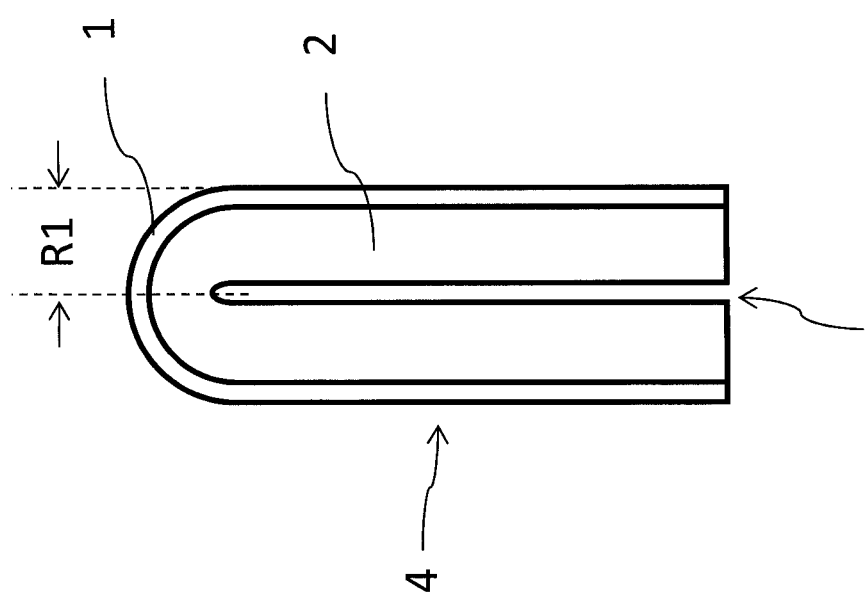
FIG. 1A shows a schematic diagram of the relative position of the conventional cover plate and the OLED display in the flexible portable device in the outward folding mode.
Figure 2:
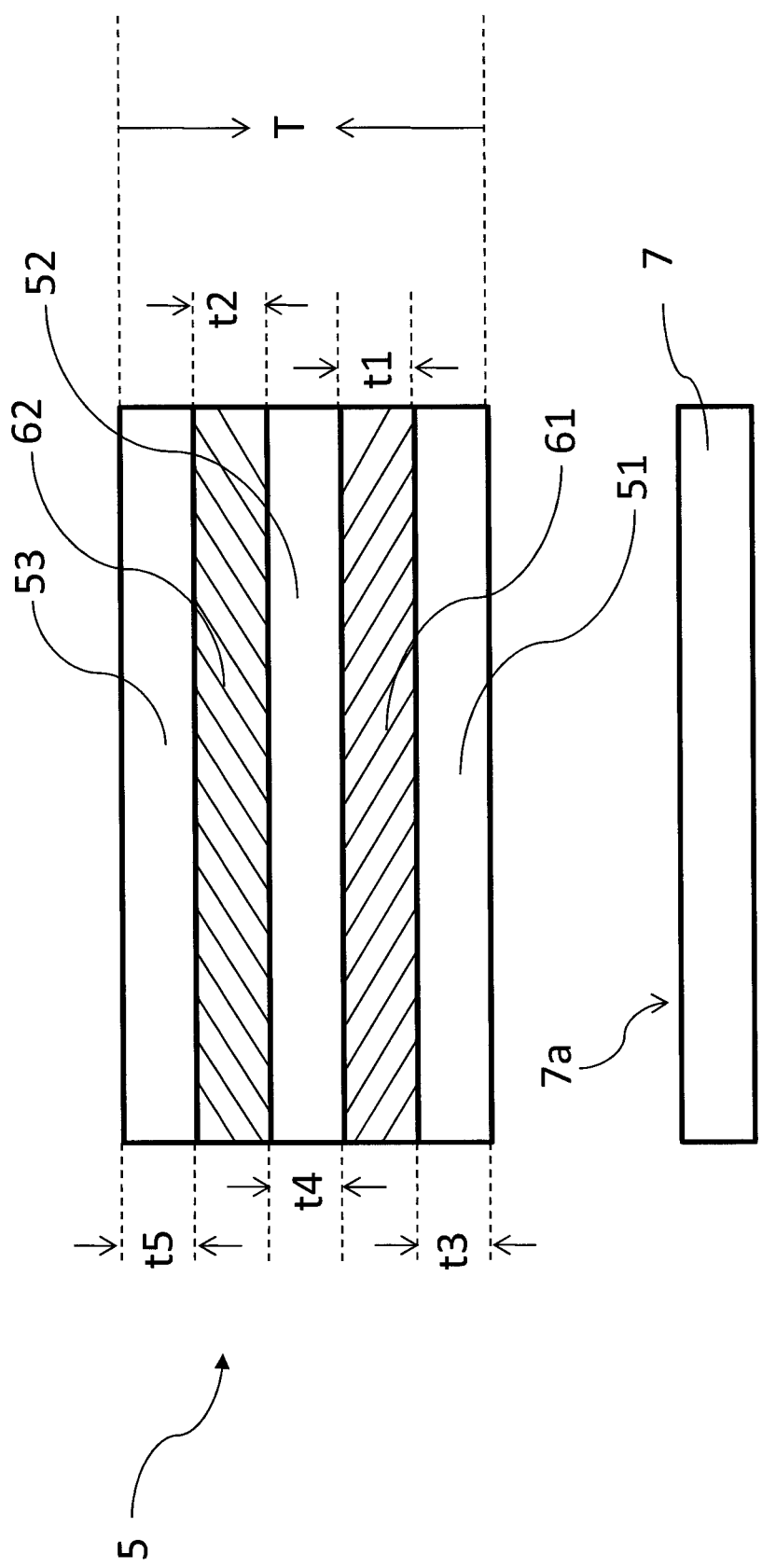
FIG. 2 shows an optical film for flexible display of an embodiment of the present invention.

Referring to FIG. 2, in an aspect of the optical film of present invention, a optical film 5 for a flexible display 7 which is disposed on a display side 7a of the flexible display 7 sequentially includes an optical substrate layer 51 adjacent to the flexible display 7, a first adhesive layer 61, a polarizing layer 52, a second adhesive layer 62, and a surface functional film 53 which is disposed on a folding side of the flexible display 7, wherein the first adhesive layer 61 has a first thickness t1; the second adhesive layer 62 has a second thickness t2; the optical substrate layer 51 has a third thickness t3; the polarizing layer 52 has a fourth thickness t4; the surface functional film 53 has a fifth thickness t5, and the optical film 5 satisfies the following formula (1):

$$17.49 \times 10^{-3} \text{ (Gpa/μm)} \leq E'/T \leq 18.77 \times 10^{-3} \text{ (Gpa/μm)} \tag{1}$$

Figure 3:
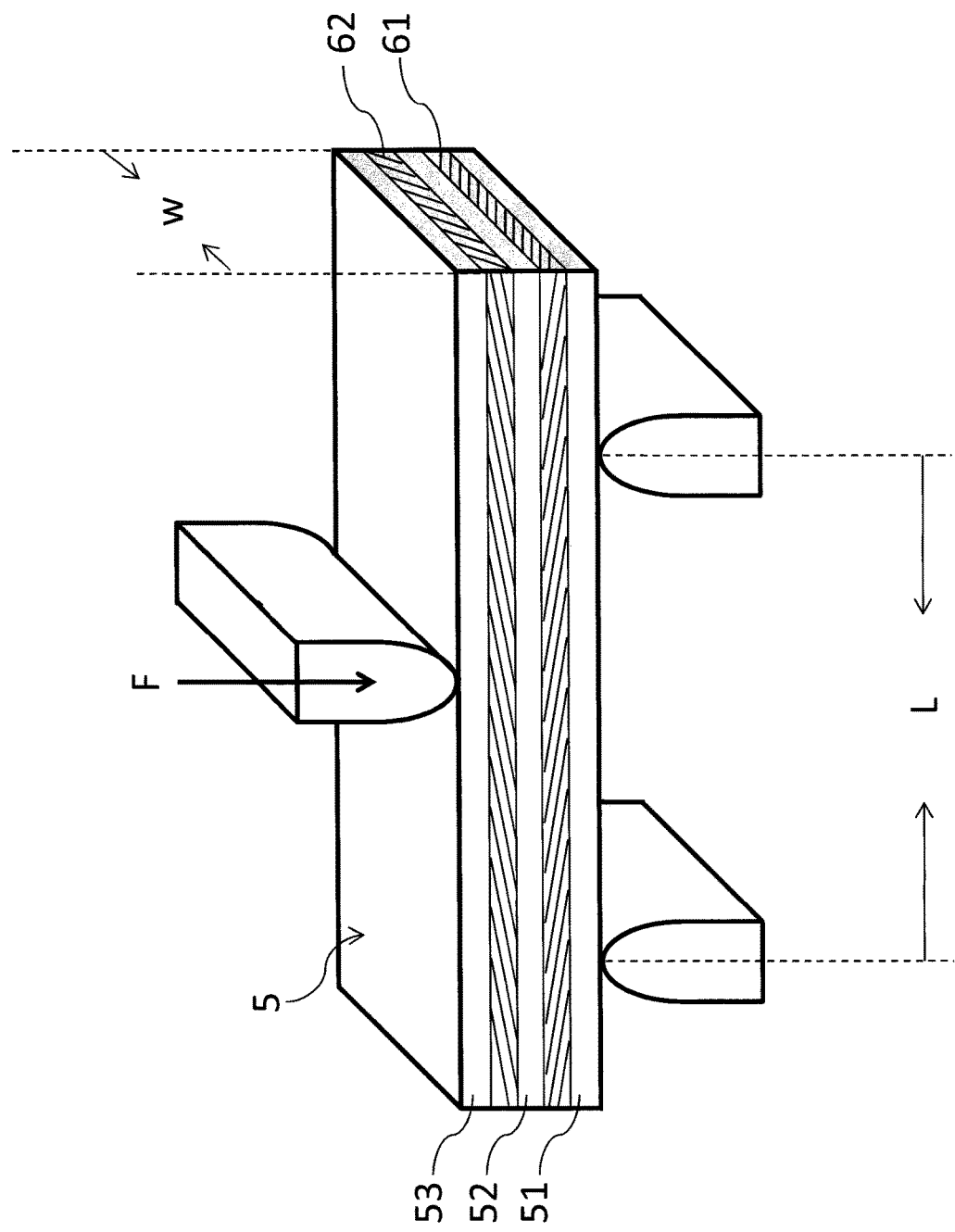
FIG. 3 shows a schematic diagram of the three-point bending test method adopted by the present invention.

Please refer to FIG. 3, which is a schematic diagram of a three-point bending test method for a theoretical model of a rectangular plate. In the above formula (1), T represents a total thickness of the optical film 5, that is (t1+t2+t3+t4+t5), and the total thickness T is between 152 μm and 191 μm, and the total thickness can affect the stress distribution of each layer and the maximum loading stress in the optical film 5 in thickness direction during bending, and E' is an integrated bending modulus obtained by the above three-point bending test and calculated by the following formula (2):

$$E'=L^3F/4wt^3d \tag{2}$$

F represents a stress applied to the optical film 5 in the three-point bending test, L represents a measuring length of the optical film 5, w represents a measuring width of the optical film 5; d represents a strain of the optical film 5 in thickness direction, and t represents a total thickness of the optical substrate layer 51, the polarizing layer 52 and the surface functional film 53, that is (t3+t4+t5). Since a single adhesive layer of the acrylic pressure sensitive adhesive is used in the present invention without any substrate, the adhesive layer has been dropped and bent due to its own gravity without applying stress F under the same test conditions of the above three-point bending test. The relative values of the stress F and the strain d cannot be obtained, and it is understood that the bending modulus of the adhesive layer in the thickness direction is much smaller than that of the substrates such as the optical substrate layer 51, the polarizing layer 52, and the surface functional film 53, and can be ignored. Therefore, to consider the source of the substantial restoring force to the optical film 5, only the integrated bending modulus provided by the optical substrate layer 51, the polarizing layer 52, and the surface functional film 53 can be applied.

Figure 4:
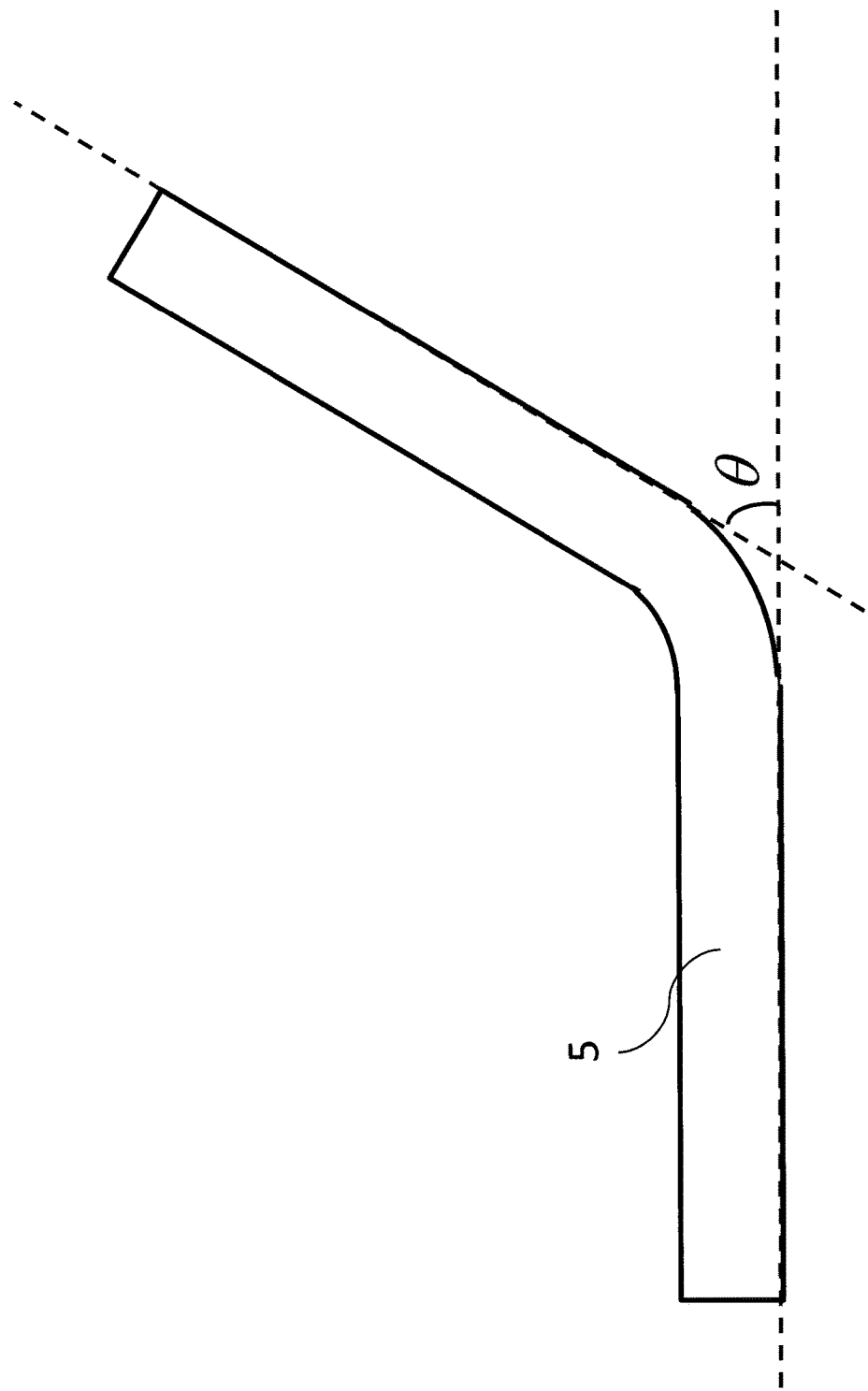
FIG. 4 shows a schematic diagram of the measuring method for the curling angle of the optical film after folding test of the present invention.

Referring to FIG. 4, FIG. 4 shows a schematic diagram of the measuring method for the curling angle θ of the optical film 5 generated by the inconsistent strain of the different layers after dynamic folding test and the static folding test. We can obtain the forces of the optical film 5 by measuring the curling angle θ in different stages after the folding test. For example, the initial curling angle θ after the folding test can represent the residual folding stress in the optical film 5, and the over time curling angle θ after releasing the folding stress and the free recovering can know whether the residual stress can be neutralized by the restoring force of the optical film 5 itself rather than accumulated in the optical film 5 to judge whether the optical film 5 is sufficient for the cover plate of the flexible display 7, and whether the optical film 5 is permanently deformed because the folding interface of the optical film 5 cannot withstand excessive stress during folding, or whether the folding interface cannot be restored to the original flat shape and defective with accumulation of repeated folding stress for a long time, because the optical film 5 itself has a poor restoring force.

Referring to the following table 1, table 1 shows the different structural thickness configurations of the film layers and the adhesive layers calculated by the above three-point bending test method; the integrated bending modulus of the film layers, and the ratio of the integrated bending modulus to the total thickness (E'/T) calculated by the formula (1) of the embodiment and the comparative examples of the optical film 5 of the present invention. Each substrate of the optical substrate layer 51, the polarizing layer 52, and the surface functional film 53 is made of transparent polyimide having a single layer bending modulus of 5 GPa to 6 Gpa. The first adhesive layer 61 is an acrylic pressure sensitive adhesive having a storage modulus G' in a range of $0.5 \times 10^5$ Pa and $1.5 \times 10^5$ Pa; the second adhesive layer 62 is an acrylic pressure sensitive adhesive having a storage modulus G' in a range of $3 \times 10^5$ Pa and $4 \times 10^5$ Pa, and the storage modulus G' of the second adhesive layer 62 is greater than the storage modulus G' of the first adhesive layer 61, and the peeling force of the first adhesive layer 61 is in a range of 600 g/mm and 800 g/mm; the peeling force of the second adhesive layer is in a range of 400 g/mm and 500 g/mm, so as to have sufficient interfacial adhesion, and the composite optical film does not peel off and can transfer the bending stress well.

TABLE 1

|  | Example 1 | Example 2 | Example 3 | Comparative Example 1 | Comparative Example 2 |
|---|---|---|---|---|---|
| Thickness of the surface functional film (t5) | 47 μm | 47 μm | 67 μm | 47 μm | 47 μm |
| Thickness of the second adhesive layer (t2) | 5 μm | 12 μm | 12 μm | 5 μm | 5 μm |
| Thickness of the polarizing layer (t4) | 50 μm | 50 μm | 50 μm | 50 μm | 50 μm |
| Thickness of the first adhesive layer (t1) | 12 μm | 12 μm | 12 μm | 5 μm | 12 μm |
| Thickness of the optical substrate layer (t3) | 50 μm | 50 μm | 50 μm | 50 μm | 38 μm |
| Total thickness of the optical substrate layer, the polarizing layer and the surface functional film (t3 + t4 + t5) | 147 μm | 147 μm | 167 μm | 147 μm | 135 μm |
| Adhesive layers (t1 + t2) | 17 μm | 24 μm | 24 μm | 10 μm | 17 μm |
| Integrated bending modulus (E') | 3.07 GPa | 3.21 GPa | 3.34 GPa | 3.64 GPa | 3.25 GPa |
| E'/T (Gpa/μm) | $18.72 \times 10^{-3}$ | $18.77 \times 10^{-3}$ | $17.49 \times 10^{-3}$ | $23.19 \times 10^{-3}$ | $21.38 \times 10^{-3}$ |

|  | Comparative Example 3 | Comparative Example 4 | Comparative Example 5 | Comparative Example 6 | Comparative Example 7 |
|---|---|---|---|---|---|
| Thickness of the surface functional film (t5) | 67 μm | 67 μm | 47 μm | 47 μm | 67 μm |
| Thickness of the second adhesive layer (t2) | 5 μm | 5 μm | 12 μm | 12 μm | 5 μm |
| Thickness of the polarizing layer (t4) | 50 μm | 50 μm | 50 μm | 50 μm | 50 μm |
| Thickness of the first adhesive layer (t1) | 12 μm | 5 μm | 5 μm | 12 μm | 12 μm |
| Thickness of the optical substrate layer (t3) | 50 μm | 50 μm | 50 μm | 38 μm | 38 μm |
| Total thickness of the optical substrate layer, the polarizing layer and the surface functional film (t3 + t4 + t5) | 167 μm | 167 μm | 147 μm | 135 μm | 155 μm |
| Adhesive layers (t1 + t2) | 17 μm | 10 μm | 17 μm | 24 μm | 17 μm |

TABLE 1-continued

| Integrated bending modulus (E') | 3.1 GPa | 3.42 GPa | 3.71 GPa | 3.89 GPa | 3.33 GPa |
|---|---|---|---|---|---|
| E'/T (Gpa/μm) | $16.85 \times 10^{-3}$ | $19.32 \times 10^{-3}$ | $22.62 \times 10^{-3}$ | $24.47 \times 10^{-3}$ | $19.36 \times 10^{-3}$ |

The test methods and conditions of the optical film of the present invention are as follows:

1. Dynamic Folding Test:

The optical film is tested by a dynamic folding tester (manufacturer: YUASA SYSTEM CO., LTD Model: DLDM111LHB). The optical film is cut into a test sample with a size of 120 mm×10 mm. The test condition is at room temperature (25° C.); at a folding frequency of 1 Hz; with a minimum folding curvature radius of 3 mm, and continued for 200,000 times. The initial curling angle after the dynamic folding test, the 24 hour over time curling angle, and the pressurized curling angle after pressurizing for 24 hours with a flat glass and then being released are measured respectively.

2. Static Folding Test:

The optical film is cut into a test sample with a size of 120 mm×10 mm. The test condition is at room temperature (25° C.), and the optical film with a minimum folding curvature radius of 3 mm is folded and clamped between two parallel flat plates, that is the two parallel flat plates has a fixed distance of twice the folding curvature radius of 6 mm. The initial curling angle after the folding test, the 24 hour over time curling angle, and the pressurized curling angle after pressurizing for 24 hours with a flat glass and then being released are also measured respectively. Table 2 and Table 3 are the results of dynamic folding test and static folding test respectively.

From the results of Table 1, it can be seen that the optical substrate layer 51, the polarizing layer 52, and the surface functional film 53 are made of substrates with the same modulus range to form several different thickness configurations. The total thickness of the optical film 5 and the thickness ratio of the optical substrate layer 51, the polarizing layer 52, and the surface functional film 53 in the optical film 5 can be changed together by changing the thickness ratio of the first adhesive layer 61 and the second adhesive layer 62 between the optical film 5, and the integrated bending modulus E' of the film layers contributed by the optical substrate layer 51, the polarizing layer 52, and the surface functional film 53 in the three-point bending test also changes, and therefore, further affects the result of the subsequent folding test.

Figure 5:
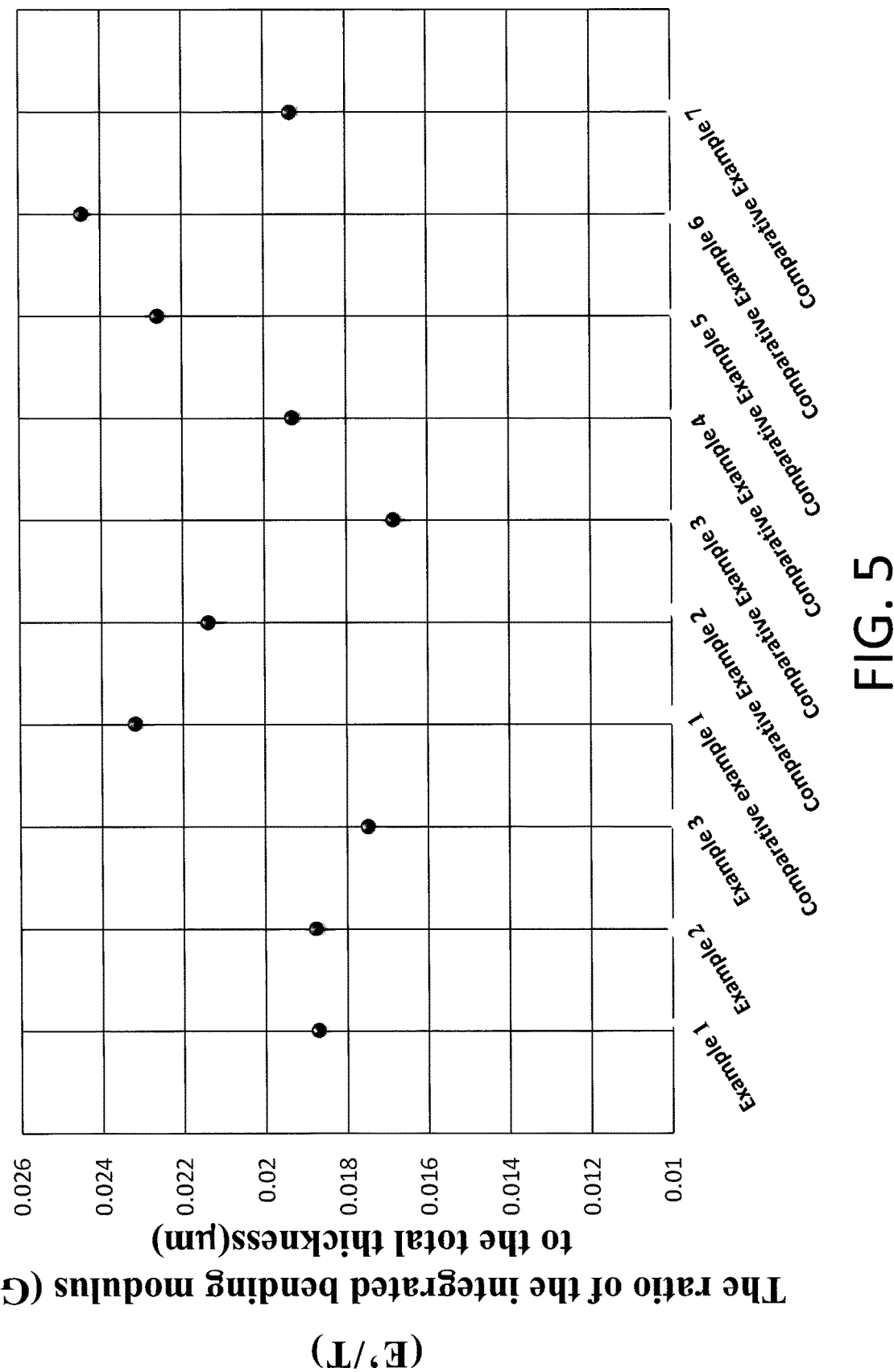
FIG. 5 shows a distribution diagram of the ratio of the integrated bending modulus to the total thickness of optical film of the embodiment examples of the present invention and the comparative examples.

Please refer to Table 2, Table 3, and FIG. 5 together. From the bending test data, the optical films of embodiments 1 to 3 of the present invention can satisfy the relationship of the following formula (1).

$$17.49 \times 10^{-3} \text{ (Gpa/μm)} \leq E'/T \leq 18.77 \times 10^{-3} \text{ (Gpa/μm)} \quad (1)$$

It represents that the optical films 5 in the above (E'/T) range have a better balance between the restoring force provided by the optical substrate layer 51, the polarizing layer 52, and the surface functional film 53 and the bending resistance for a large bending stress caused by the increasing total thickness of the optical films 5. Therefore, the embodiments in

TABLE 2

| Dynamic Folding Test | Example 1 | Example 2 | Example 3 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|
| Initial curling angle (°) | 25 | 31 | 35 | 53 | 50 | 45 | 40 | 50 | 65 | 44 |
| Over time curling angle (°) | 1 | 3 | 6 | 36 | 29 | 17 | 10 | 32 | 50 | 17 |
| Pressurized curling angle (°) | 0 | 3 | 2 | 35 | 25 | 11 | 6 | 30 | 50 | 10 |
| Determined Result | ○ | ○ | ○ | X | X | Δ | Δ | X | X | Δ |

TABLE 3

| Static Folding Test | Example 1 | Example 2 | Example 3 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|
| Initial curling angle (°) | 22 | 25 | 32 | 57 | 46 | 43 | 31 | 55 | 56 | 41 |
| Over time curling angle (°) | 0 | 5 | 5 | 50 | 27 | 14 | 3 | 36 | 38 | 17 |
| Pressurized curling angle (°) | 0 | 1 | 2 | 43 | 18 | 6 | 1 | 29 | 40 | 12 |
| Determined Result | ○ | ○ | ○ | X | X | Δ | ○ | X | X | Δ | both of the dynamic folding test and the static folding test can have a small initial curling angle (<40°), and the residual folding stress of the embodiments in the folding test with a folding curvature radius of at least 3 mm can be evenly dispersed and minimized. The over time curling angle of the embodiments can also be greatly reduced (<10°). It is obvious that the recovery rates of the optical films 5 of the embodiments are excellent, and represents that the restoring forces of the optical films 5 themselves are sufficient to overcome the increased bending stress caused by the increased thickness of the multilayer composite structure. Therefore, without any external force, only relying on the recovery property of the optical films 5 themselves can largely neutralize the residual folding stress, so that the residual folding stress does not accumulate in the optical films 5 over time, and the material does not fatigue due to repeated dynamic folding, or occur irreversible creep due to long time static folding. In addition, by the pressurized curling angle values (≤3°), it can be seen that after pressurizing the optical films 5 for a period of time and then releasing the pressure, the strain and curling angle can be further reduced by applying the extra restoring force. Therefore, in practical applications, when the optical film 5 is directly disposed on the surface of the flexible display such as an OLED display as a cover plate for a long period of time, the unfolding stress of the planarized portable device can further increase the recovery property of the optical film 5, and regardless of the dynamic folding or static folding storage, the optical film 5 of the present invention almost does not accumulate and residue the folding stress in the composite film structure.

In another aspect of the optical film of present invention, the integrated bending modulus E' is in a range of 2.65 Gpa to 3.58 Gpa, and preferable in a range of 3.07 Gpa to 3.34 Gpa. The optical substrate layer 51, the polarizing layer 52, and the surface functional film 53 are made of materials selected from the group consisting of polyimide, poly(ethylene terephthalate), poly(methyl methacrylate) polymer, epoxy resin polymer, polysiloxane polymer, cellulose acetate polymer, and a combination thereof, and the materials can be selected from the range conforming to above integrated bending modulus E' according to the required thickness of the optical film 5, optical property or durability.

Referring to FIG. 5, when the integrated bending modulus E' of the optical substrate layer 51, the polarizing layer 52, and the surface functional film 53 is too large, the (E'/T) ratio is too high and far from the preferred range, such as comparative example 1, comparative example 5, and comparative example 6. It is necessary to appropriately increase the total thickness T of the optical film 5 or to adjust the thickness of the first adhesive layer 61 or the second adhesive layer 62, so that the integrated bending modulus E' is reduced together, and therefore, a balance can be achieved between the restoring force and the extrusion and tensile stress during folding. However, this is inconsistent with the trend toward the current thinning development of portable devices.

In other aspect of the optical film of present invention, under the only few thickness combinations of the optical substrate layer 51, the polarizing layer 52, and the surface functional film 53, the ratio of the integrated bending modulus E' of the optical substrate layer 51, the polarizing layer 52, and the surface functional film 53 to the total thickness T of the optical film 5 can be adjusted by the first thickness t1 of the first adhesive layer 61 and the second thickness t2 of the second adhesive layer 62 between the optical films 5 accordingly. Therefore, the selectivity of the materials of the film layers is correspondingly increased. The first adhesive layer 61 has a first thickness t1 in a range of 5 μm to 12 μm, and the ratio of the first thickness t1 to the total thickness T of the optical film 5 is preferable between 6.28% and 7.32%. The second adhesive layer 62 has a second thickness t2 in a range of 5 μm to 12 μm, and the ratio of the second thickness t2 of the second adhesive layer 62 to the total thickness T of the optical film 5 is preferable between 3.05% and 7.02%. More preferably, the first thickness t1 of the first adhesive layer 61 is greater than or equal to the second thickness t2 of the second adhesive layer 62 to obtain a better adjustment effect of appropriate integrated bending modulus E'.

In other aspect of the optical film of present invention, the optical substrate layer 51 has a thickness t3 in a range of 38 μm to 57 μm; the polarizing layer 52 has a thickness t4 in a range of 38 μm to 57 μm, and the surface functional film 53 has a thickness t5 in a range of 43 μm to 67 μm. The ratio of the total thickness t of the optical substrate layer 51, the polarizing layer 52, and the surface functional film 53 to the total thickness T of the optical film 5 can be correspondingly adjusted in a range of 85.96% to 89.63% by adjusting the first thickness t1 of the first adhesive layer 61 and the second thickness t2 of the second adhesive layer 62 between the optical films 5 to obtain sufficient restoring force and to generate less bending stress when folded.

Figure 6:
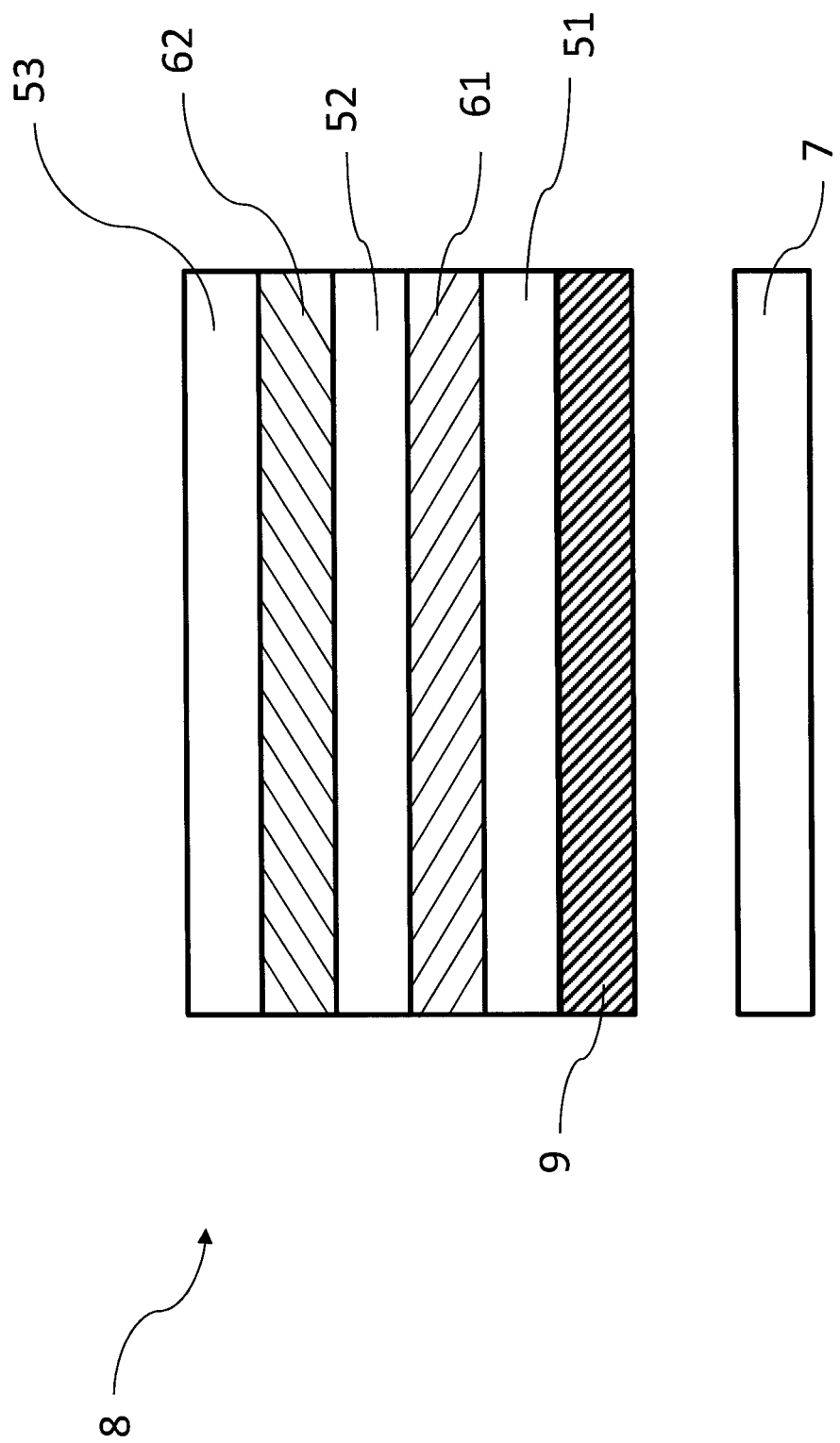
FIG. 6 shows an optical film for flexible display of another embodiment of the present invention.

Referring to FIG. 6, in other aspect of the optical film of present invention, a the optical film 8 further comprises a third adhesive layer 9 between the optical substrate layer 51 and the flexible display 7 to directly attach the optical film 8 to the flexible display 7. Therefore, there is no air interface between the flexible display 7 and the optical film 8 as the cover plate, and the flexible display 7 can have better optical characteristics. In addition, the optical film 8 can also share part of the stress transmitted from the flexible display 7 when the stress does not exceed the upper limit of the restoring force of the optical film 8 itself can withstand, so that the flexible portable device using the optical film 8 of the present invention is more diverse in structural design.

In other aspect of the optical film of present invention, the optical substrate layer 51 comprises a coating-type retardation film, an extending-type retardation film or a microstructure-type retardation film.

In other aspect of the optical film of present invention, the polarizing layer 52 comprises an extending-type polarizer or a coating-type polarizer In other aspect of the optical film of present invention, the surface functional film 53 is selected from the group consisting of an anti-glare film, a hard coating film, an anti-fouling film, a barrier film and a combination thereof.

In other aspect of the optical film of present invention, the polarizing layer 52 is an integrated circular polarizer, and the optical substrate layer 51 is an integrated chromatic aberration compensation film. Therefore, the flexible display 7 using the optical film 5 of the present invention has excellent display effects at different viewing angles and different degrees of bending or folding.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical film for a cover plate of a flexible display, which is disposed on a display side of the flexible display sequentially including:
   an optical substrate layer having a thickness in a range of 38 μm to 57 μm adjacent to the flexible display;
   a first adhesive layer having a first thickness t1 in a range of 5 μm to 12 μm, and the first adhesive layer is an acrylic pressure sensitive adhesive having a storage modulus G' of between $0.5 \times 10^5$ Pa and $1.5 \times 10^5$ Pa;
   a polarizing layer having a thickness in a range of 38 μm to 57 μm;
   a second adhesive layer having a second thickness t2 in a range of 5 μm to 12 μm, and the second adhesive layer is an acrylic pressure sensitive adhesive having a storage modulus G' of between $3 \times 10^5$ Pa and $4 \times 10^5$ Pa; and
   a surface functional film having a thickness in a range of 43 μm to 67 μm which is disposed on a folding side of the flexible display;
   wherein the optical film satisfies the following formula (1):

$$17.49 \times 10^{-3} \text{ (Gpa/μm)} \leq E'/T \leq 18.77 \times 10^{-3} \text{ (Gpa/μm)} \quad (1)$$

wherein T represents a total thickness of the optical film, and the total thickness T is between 152 μm and 191 μm, and E' is an integrated bending modulus in a range of 2.65 Gpa to 3.58 Gpa obtained by three-point bending test and calculated by the following formula (2):

$$E' = L^3 F / 4wt^3 d \quad (2)$$

wherein F represents a stress applied to the optical film in the three-point bending test, L represents a measuring length of the optical film, w represents a measuring width of the optical film, d represents a strain of the optical film, and t represents a total thickness of the optical substrate layer, the polarizing layer and the surface functional film.

2. The optical film according to claim 1, wherein the ratio of the first thickness t1 of the first adhesive layer to the total thickness T of the optical film is between 6.28% and 7.32%, and the ratio of the second thickness t2 of the second adhesive layer to the total thickness T of the optical film is between 3.05% and 7.02%.

3. The optical film according to claim 2, wherein the first thickness t1 of the first adhesive layer is greater than or equal to the second thickness t2 of the second adhesive layer.

4. The optical film according to claim 1, wherein the ratio of the total thickness t of the optical substrate layer, the polarizing layer, and the surface functional film to the total thickness T of the optical film is between 85.96% and 89.63%.

5. The optical film according to claim 1, further comprising a third adhesive layer between the optical substrate layer and the flexible display to directly attach the optical film to the flexible display.

6. The optical film according to claim 1, wherein the optical substrate layer, the polarizing layer, and the surface functional film are made of materials selected from the group consisting of polyimide, poly(ethylene terephthalate), poly(methyl methacrylate) polymer, epoxy resin polymer, polysiloxane polymer, cellulose acetate polymer, and a combination thereof.

7. The optical film according to claim 1, wherein the optical substrate layer comprises a coated retardation film, an extended retardation film or a microstructured retardation film.

8. The optical film according to claim 1, wherein the polarizing layer comprises an extended polarizer or a coated polarizer.

9. The optical film according to claim 1, wherein the surface functional film is selected from the group consisting of an anti-glare film, a hard coating film, an anti-fouling film, a barrier film, and a combination thereof.

* * * * *